United States Patent
Bae

(10) Patent No.: US 7,083,900 B2
(45) Date of Patent: *Aug. 1, 2006

(54) METHOD FOR MANUFACTURING A LIQUID CRYSTAL DISPLAY DEVICE

(75) Inventor: Sung Joon Bae, Kyoungki-Do (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/075,948

(22) Filed: Mar. 10, 2005

(65) Prior Publication Data

US 2005/0202349 A1    Sep. 15, 2005

Related U.S. Application Data

(63) Continuation-in-part of application No. 10/141,952, filed on May 10, 2002, which is a continuation of application No. 09/200,200, filed on Nov. 25, 1998, now Pat. No. 6,410,211.

(30) Foreign Application Priority Data

Nov. 27, 1997   (KR) ................... 1997-63559

(51) Int. Cl.
*G02F 7/00* (2006.01)
(52) U.S. Cl. ............ 430/319; 430/311; 430/318; 430/321; 430/396
(58) Field of Classification Search ............ None
See application file for complete search history.

(56) References Cited

U.S. PATENT DOCUMENTS

| | | | |
|---|---|---|---|
| 4,231,811 A | 11/1980 | Somekh et al. | |
| 4,762,396 A | 8/1988 | Dumant et al. | |
| 5,985,766 A | 11/1999 | Wu et al. | |
| 6,043,000 A | 3/2000 | Park et al. | |
| 6,410,211 B1 * | 6/2002 | Bae ................ | 430/318 |

FOREIGN PATENT DOCUMENTS

| | | |
|---|---|---|
| GB | 2 314 209 A | 12/1997 |
| JP | 01-100518 A | 4/1989 |
| JP | 05-003164 A | 1/1993 |
| JP | 05-343535 A | 12/1993 |
| JP | 7-28074 A | 1/1995 |

* cited by examiner

*Primary Examiner*—John A. McPherson
(74) *Attorney, Agent, or Firm*—Birch, Stewart, Kolasch & Birch, LLP

(57) ABSTRACT

A method for manufacturing an LCD including at least two stacked thin layers in which the upper thin film smoothly and completely covers the lower thin film includes the steps of coating a photo-resist on a patterned layer, patterning the photo-resist by exposing and developing the photo-resist with a mask which has lines and spaces in which a distance between the lines is smaller than a resolution of an exposure system used and etching the metal layer using the patterned photo-resist as a mask. The resulting photo-resist pattern has a comb shape.

24 Claims, 8 Drawing Sheets

METHOD FOR MANUFACTURING A LIQUID CRYSTAL DISPLAY DEVICE

This application is a continuation-in-part of application Ser. No. 10/141,952, filed on May 10, 2002, which is a continuation of Ser. No. 09/200,200, filed Nov. 25, 1998 now U.S. Pat. No. 6,410,211 and for which priority is claimed under 35 U.S.C. § 120; and this application claims priority of Application No. 1997-63559 filed in Korea on Nov. 27, 1997 under 35 U.S.C. § 119; the entire contents of all are hereby incorporated by reference.

BACKGROUND OF THE INVENTION

1. Field of the Invention

The present invention relates to a method of manufacturing a liquid crystal display device (LCD) and more specifically, to a method for manufacturing an LCD including at least two stacked thin layers in which the upper thin film smoothly and completely covers the lower thin film and in which a photo-resist layer is formed in a single masking step to have a thick portion and a thin portion.

2. Description of the Background Art

A thin film type liquid crystal display device includes an upper panel, a lower panel and a liquid crystal material inserted therebetween. At the outer side of the two joined panels, polarizing plates are attached. The upper panel includes an inner side having a color filter and a common electrode and an outer side having a polarizing plate. As seen in FIGS. 1, 2, 3a and 3b, the lower panel includes an outer side having another polarizing plate and an inner side having a plurality of gate bus lines 10 and a gate pad 10a, a plurality of data bus lines 20 and data pad 20a, a TFT switching element C and a pixel electrode 30.

The structure of the lower panel is explained hereafter in detail, referring to FIG. 2 which shows a plan view of the conventional LCD and FIG. 3a which shows a cross-sectional view of the conventional LCD along the line A—A of FIG. 2.

A plurality of the gate bus lines 10 perpendicularly cross a plurality of the data bus lines 20. The TFT switching element C, which includes a gate electrode 11 which is derived from the gate bus line 10, a source electrode 21 which is derived from the data bus line 20 and a drain electrode 22 which faces the source electrode 21, is disposed at the intersection portion of the gate bus line 10 and the data bus line 20. A pixel electrode 30 connected to the drain electrode 22 and an output electrode of the TFT C are formed in the area surrounded by the gate line 10 and the source line 20.

The process of manufacturing the lower panel of the conventional LCD is explained hereinafter.

A first metal layer is formed by depositing aluminum or aluminum alloy on a transparent substrate 1. A plurality of gate bus lines 10, a gate pad 10a and a gate electrode 11 derived from the gate bus line 10 are formed by etching the first metal layer.

A gate insulating layer 12 which has a good adhesive property with an amorphous silicon and a high insulating property, such as $SiN_x$ or $SiO_x$, is formed on the substrate 1 which includes the gate bus line 10, the gate electrode 11 and the gate pad 10a.

On the gate insulating layer 12, an amorphous silicon and an n+ type impurity doped amorphous silicon are sequentially deposited and patterned to form an intrinsic semiconductor layer 15 and a doped semiconductor layer 16 (or an ohmic contact layer).

A second metal layer is formed on the entire surface of the substrate, and may be formed of aluminum or aluminum alloy. The second metal layer is patterned to form a plurality of data bus lines 20 which perpendicularly cross the gate bus lines 10, a data pad 20a which is disposed at the each end of the data bus line 10, a source electrode 21 which is derived from the data bus line 20 and a drain electrode 22 which faces the source electrode 21. As a result, a TFT switching element including the gate electrode 11, the semiconductor layers 15 and 16, the source electrode 21 and the drain electrode 22 is completed.

On the substrate including the gate bus line 10, the data bus line 20, the gate pad 10a, the data pad 20a and the switching element, a passivation layer 23 is formed using $SiN_x$, $SiO_x$ or BCB(benzocyclobutene). A contact hole is formed by removing some portion of the passivation layer 23 which covers the drain electrode 22 to expose some portions of the drain electrode 22.

An ITO(Indium Tin Oxide) layer is deposited on the passivation layer 23 via a sputtering method. The pixel electrode 30 is formed by patterning the ITO layer. The pixel electrode 30 is connected to the drain electrode 22 through the contact hole.

The method of manufacturing the conventional LCD includes many processes for forming thin layers which are stacked on each other, and the thin layers are deposited and patterned via masking processes. The LCD according to this conventional method has a stacked structure as shown in FIG. 3a in which the gate bus line 10 and the data bus line 20, the gate electrode 11 and the data electrode 21, the pixel electrode 30 and the drain electrode 22 cross each other.

In this stacked structure, the cross-sectional shape of the lower layer is a main factor for determining the deposited state of the upper layer. If the cross sectional shape of the lower layer has an inverse tapered shape or a shoulder, the upper layer deposited thereon has discontinued or unstable portions.

For example, as shown in FIG. 3b, the cross-sectional shape, taken along the line B—B of FIG. 2, of the drain electrode 22 determines how the passivation layer 23 and the pixel electrode 30 will be deposited thereon. When the cross-sectional shape of the drain electrode 22 has an inverse tapered shape, the passivation layer 23 has a shoulder 24 or crack formed therein. At these portions having the shoulder 24 or the cracks, the pixel electrode 30 when deposited has a greatly reduced thickness or is even discontinued at this portion. Furthermore, when the pixel electrode is patterned by using an etchant on the cracked passivation layer, the drain electrode can be damaged by the etchant as it spreads or percolates through the cracks.

SUMMARY OF THE INVENTION

To overcome the problems described above, the preferred embodiments of the present invention provide a method of forming stacked thin layers in which intersecting portions of the stacked thin layers have a smoothly tapered cross-sectional shape to prevent formation of cracked or discontinued portions. In addition, preferred embodiments of the present invention provide a method of manufacturing an LCD in which a photo-resist layer having different thicknesses is formed in a single masking step.

According to one preferred embodiment of the present invention, a method of manufacturing a semiconductor device includes the steps of providing a substrate; forming a first metal layer on the substrate; forming a photoresist on the first metal layer; and exposing and developing the photoresist using an exposure system and only a single mask having lines and spaces, and a ratio of a width of a line to a resolution of the exposure system ranges between approximately 3/10 and 1/2 and a ratio of a width of a space to a resolution of the exposure system ranges between approximately 1/10 and 1/2, the lines being branched out from a side portion of the mask, such that the photoresist has a pattern including a thick portion and a thin portion, the pattern being a comb shape.

In another preferred embodiment of the present invention, a method of manufacturing a semiconductor device includes the steps of providing a substrate; forming a layer on the substrate; forming a photoresist on the layer; and performing a single masking step using an exposure system and a mask having lines and spaces, wherein a ratio of a width of a line to a resolution of the exposure system ranges between approximately 3/10 and 1/2, and a ratio of a width of a space to a resolution of the exposure system ranges between approximately 1/10 and 1/2, the lines being branched out from a side portion of the mask, the masking step being used to develop the photoresist such that the photoresist has a thick portion and a thin portion, the photoresist having a comb shape.

In another preferred embodiment of the present invention, a method of manufacturing a semiconductor device includes the steps of providing a substrate; forming a first metal layer on the substrate; forming a photoresist on the first metal layer; and exposing and developing the photoresist using an exposure system and only a single mask having lines and spaces, and a ratio of a width of a line to a resolution of the exposure system ranges between approximately 3/10 and 1/2, and a ratio of a width of a space to a resolution of the exposure system ranges between approximately 1/10 and 1/2, the lines being branched out from a side portion of the mask such that the photoresist has a pattern including a thick portion and a thin portion.

In another preferred embodiment of the present invention, a method of manufacturing a semiconductor device includes the steps of providing a substrate; forming a layer on the substrate; forming a photoresist on the layer; and performing a single masking step using an exposure system and a mask having lines and spaces, and a ratio of a width of a line to a resolution of the exposure system ranges between approximately 3/10 and 1/2, and a ratio of a width of a space to a resolution of the exposure system ranges between approximately 1/10 and 1/2, the lines being branched out from a side portion of the mask, the masking step being used to develop the photoresist such that the photoresist has a thick portion and a thin portion.

In another preferred embodiment of the present invention, a method of manufacturing a semiconductor device includes the steps of providing a substrate; forming a first metal layer on the substrate; forming a photoresist on the first metal layer; and exposing and developing the photoresist using an exposure system and only a single mask having lines and spaces branched from a side portion of the mask, wherein a width of each line and a width of each space are different from each other, such that the photoresist has a pattern including a thick portion and a thin portion.

BRIEF DESCRIPTION OF THE ATTACHED DRAWINGS

The present invention will become more fully understood from the detailed description of preferred embodiments provided hereinafter and by the accompanying drawings which are by way of illustration and therefore not limitative of the present invention and wherein.

Figure 8A:
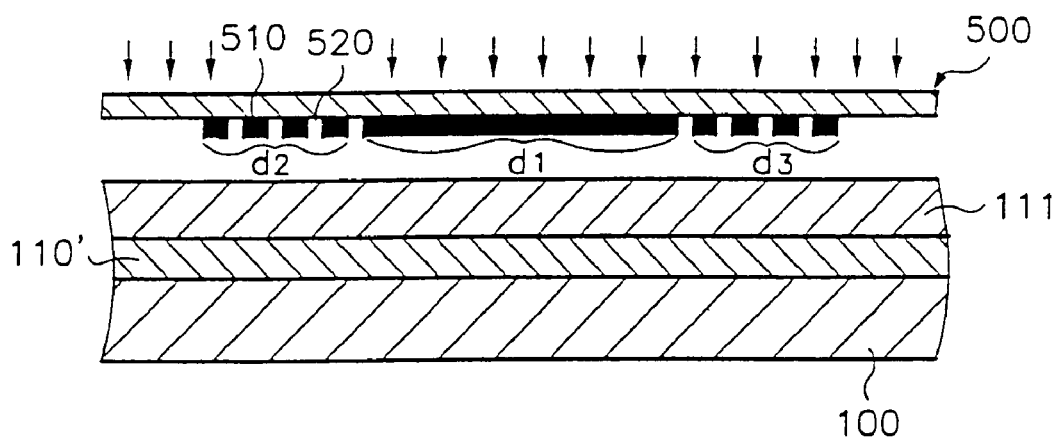
Figure 8B:
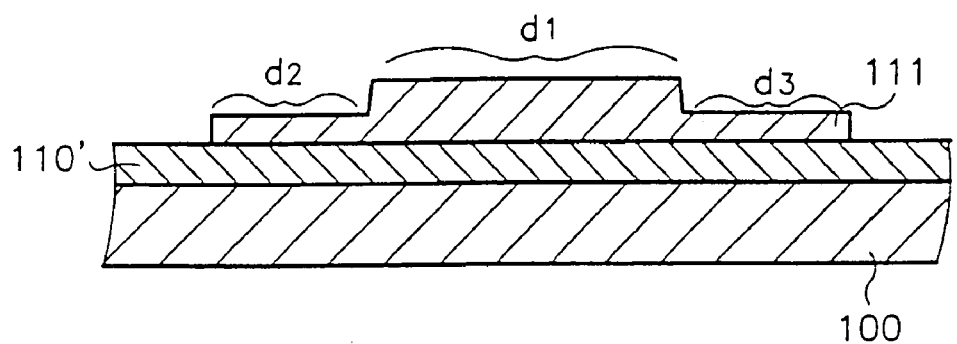
Figure 8C:
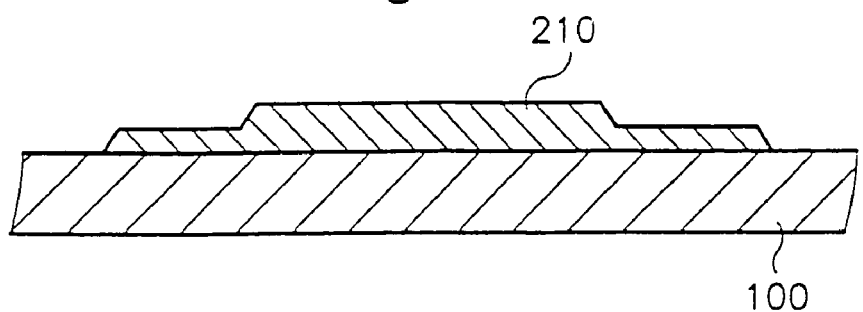
Figure 9:
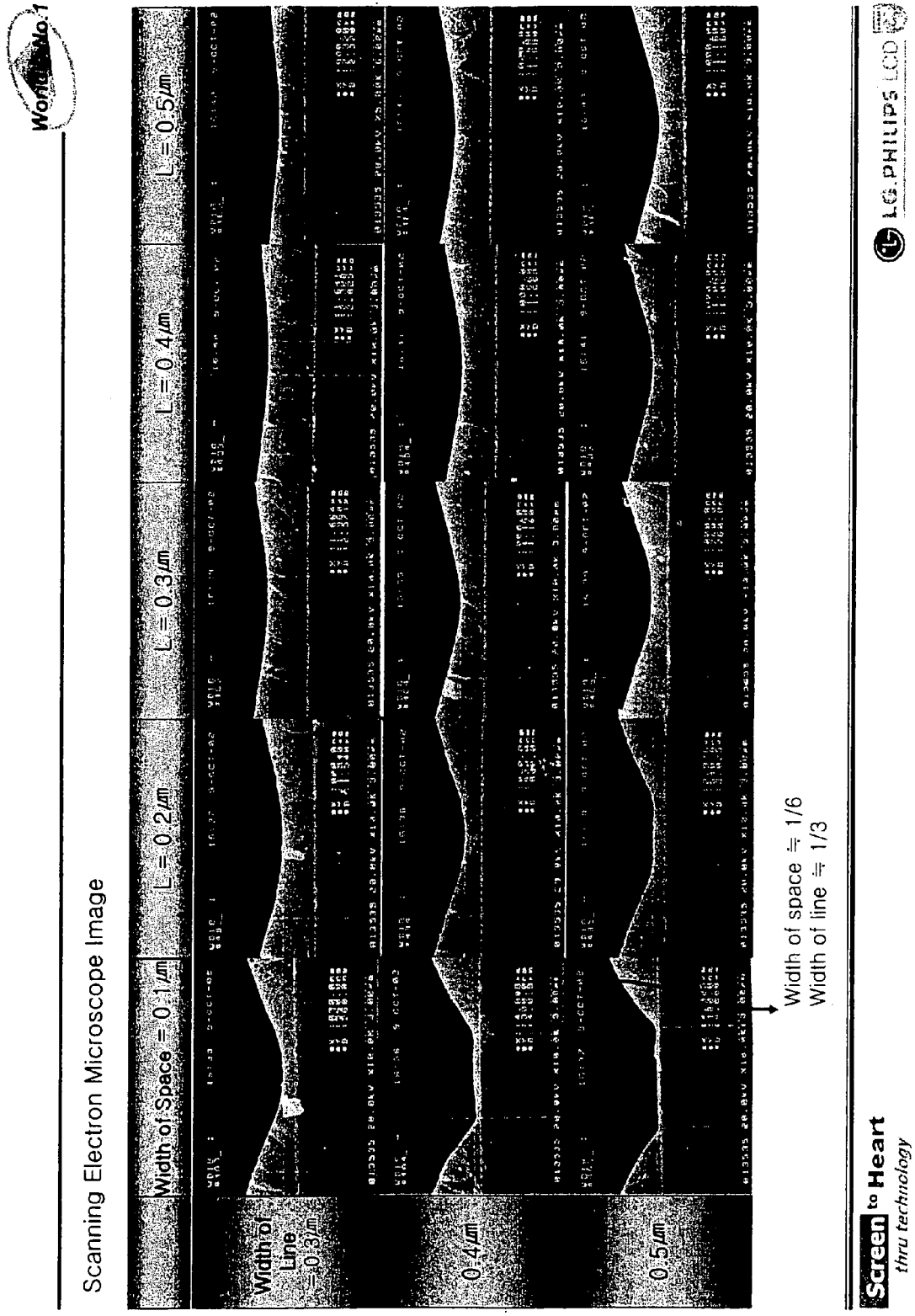

FIGS. 8a–8c show cross-sectional views for explaining an exposing process for the photo-resist by using a mask which includes lines and spaces and an etching process for the metal layer by using the photoresist according to a preferred embodiment of the present invention; and FIG. 9 is a set of cross-sectional SEM (Scanning Electron Microscope) images showing various results of the patterned photoresist with a line and space pattern in which the width of line and space are varied.

DETAILED DESCRIPTION OF PREFERRED EMBODIMENTS

Referring to the Figures, embodiments of the present invention will be explained in detail. FIGS. 6a–6i are cross-sectional views which show a method of manufacturing an LCD panel according to a preferred embodiment of the present invention.

Figure 1:
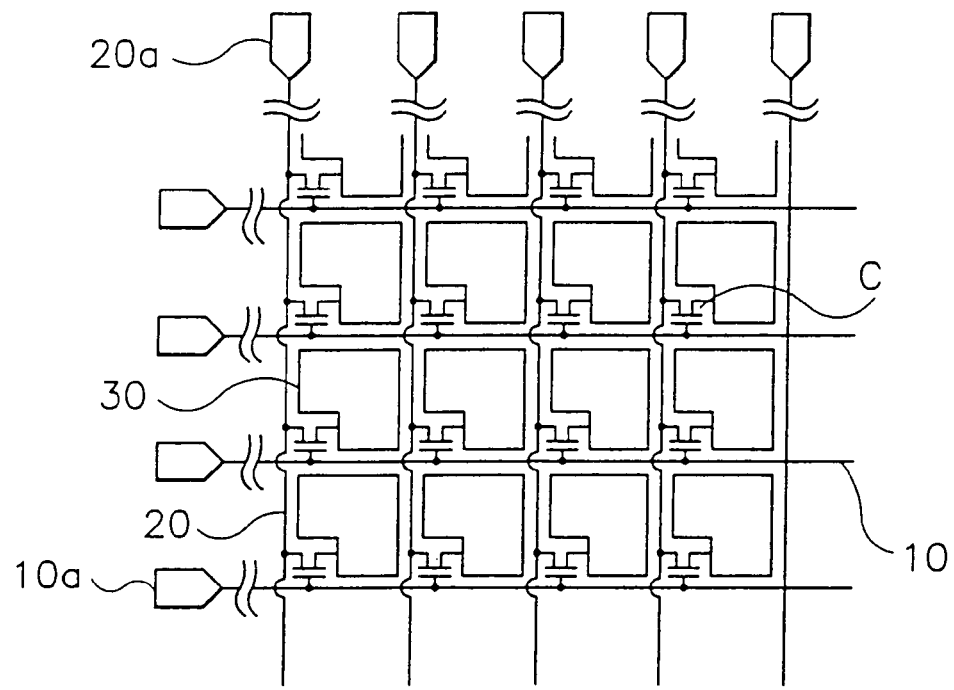
FIG. 1 is a circuit diagram of the lower panel of a conventional liquid crystal display device.
Figure 2:
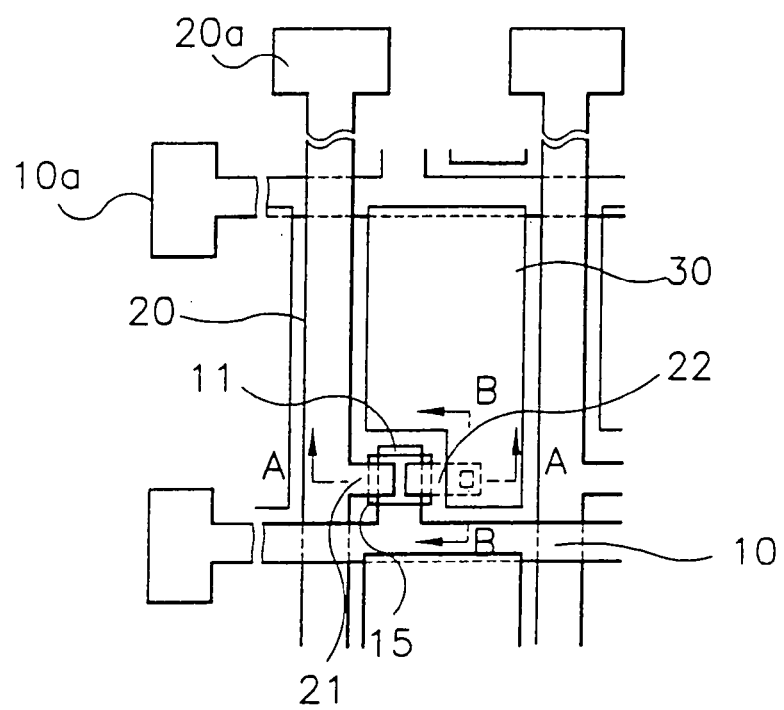
FIG. 2 is a plan view showing the lower panel of the conventional liquid crystal display device.
Figure 3A:
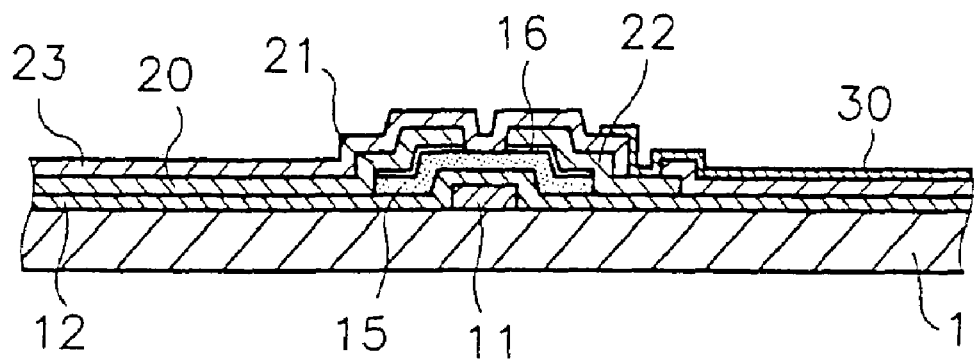
FIG. 3a is a cross-sectional view along the line A—A of the FIG. 2.
Figure 3B:
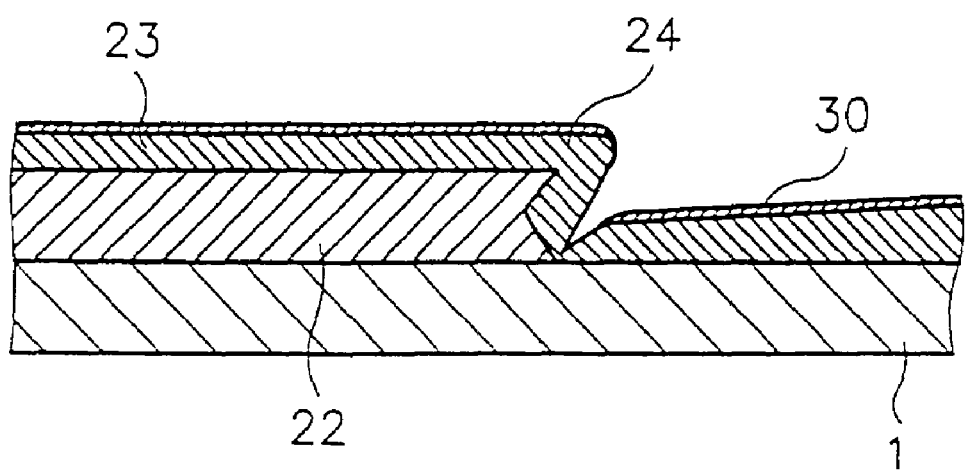
FIG. 3b is a cross-sectional view along the line B—B of the FIG. 2.
Figure 4:
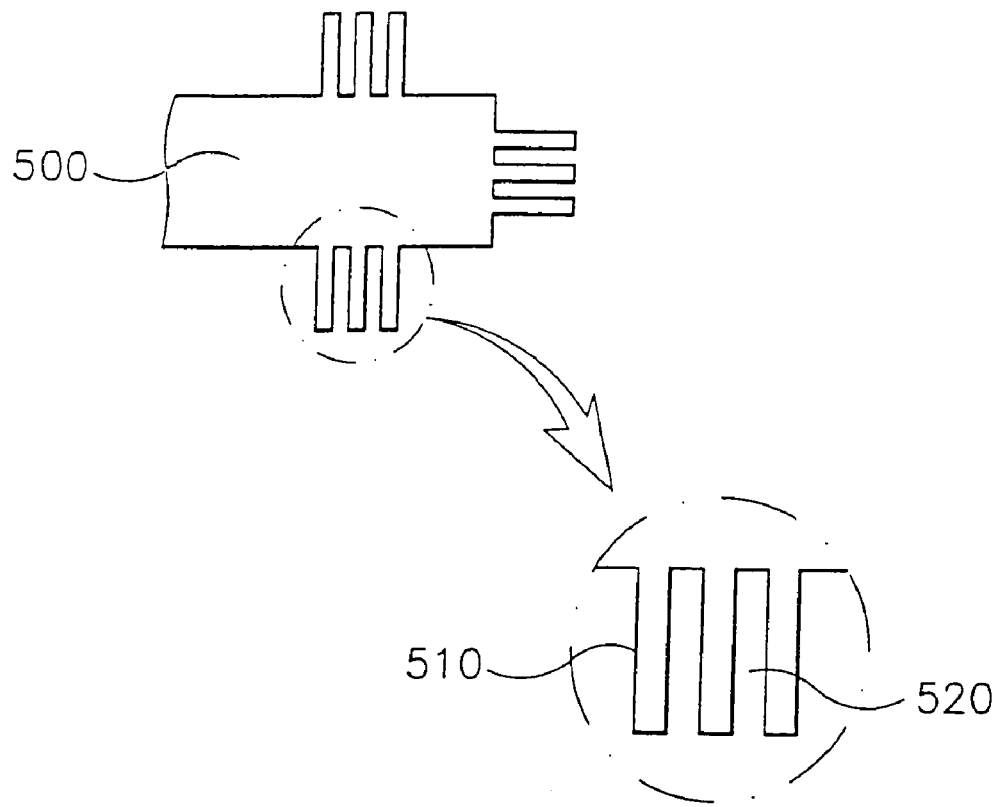
FIG. 4 shows a mask pattern including lines and spaces according to a preferred embodiment of the present invention.
Figure 5:
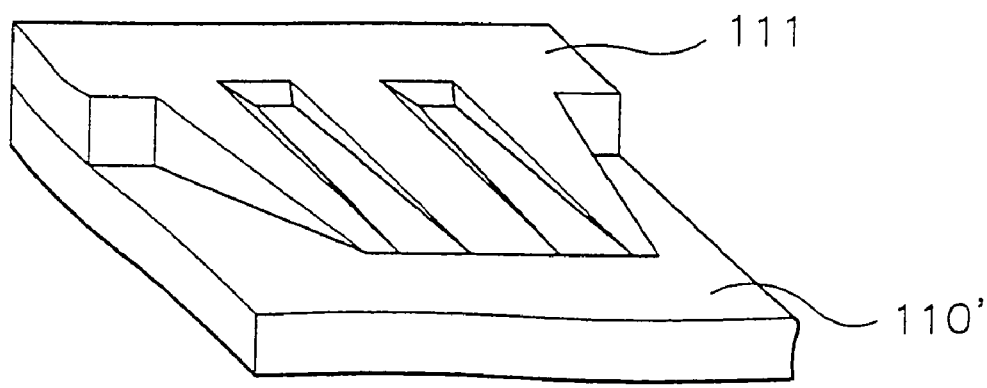
FIG. 5 shows a patterned photo-resist on a metal layer using the mask which include lines and spaces according to a preferred embodiment of the present invention.
Figure 6A:
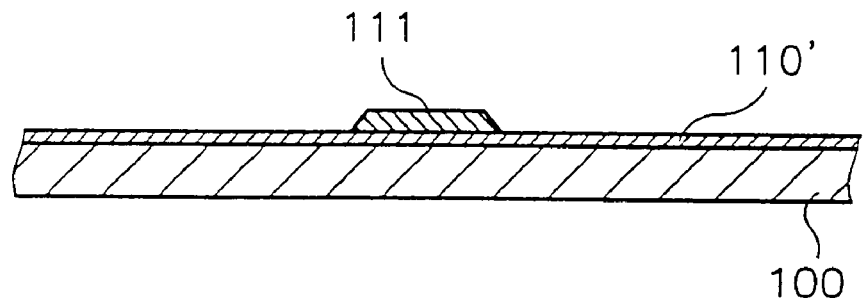
FIGS. 6a–6i show cross-sectional views for illustrating a process of forming a liquid crystal display device according to a preferred embodiment of the present invention.

On a transparent substrate 100, aluminum or aluminum alloy are applied to form a first metal layer 110' as shown in FIG. 6a. A photo-resist is coated on the first metal layer 110'. The photo-resist is patterned by using a novel mask 500, as shown in FIG. 4. More particularly, the mask 500 includes lines separated by spaces and the lines are arranged such that a distance between adjacent lines is smaller than a resolution of an exposure system used with the mask in the step of exposing the photo-resist. The lines and spaces of the mask are preferably located at the edge portions of the pattern of the mask. Generally, the exposure system has the resolution of 3–4 μm(FX-510D: Nikon of Japan 2.4 μm(independent), 3 μm(US)). Therefore, the mask 500 preferably has a comb pattern of lines and spaces in which a plurality of lines 510 having a width of about 1 μm and a plurality of spaces 520 having a width of about 0.5 μm is formed therebetween.

Figure 6B:
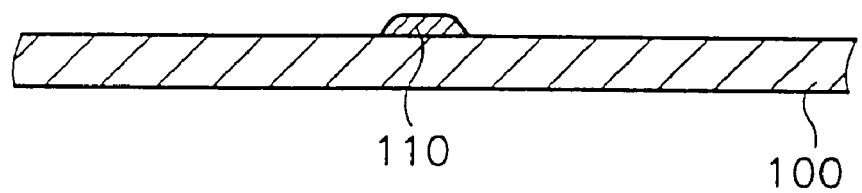

The first metal layer 110' is patterned according to the photo-resist pattern disposed thereon to form a plurality of gate lines, a gate pad and a gate electrode 110 derived from the gate bus line as shown in FIG. 6b. After the first metal layer 110' is etched, the remaining photo-resist thereon is removed.

Figure 6C:
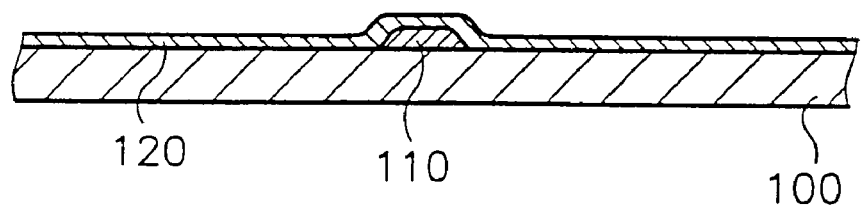

A gate insulating layer 120 is deposited on the substrate 100 including the gate electrode 110 using an insulating material having a high insulating property and a good adhesive property such as $SiN_x$ or $SiO_x$, as shown in FIG. 6c.

Figure 6D:
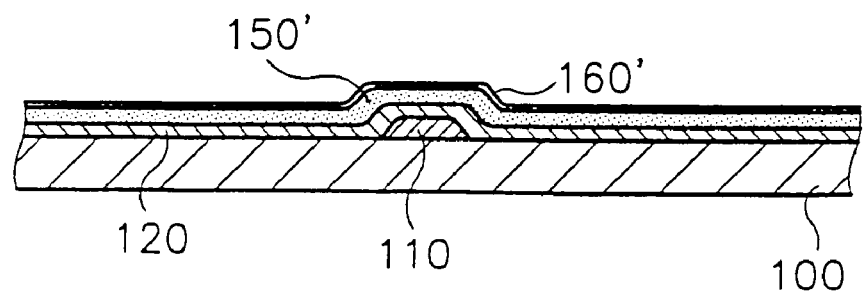

An amorphous silicon 150' and an n⁺ type impurity doped amorphous silicon 160' are sequentially deposited on the gate insulating layer 120 as shown in FIG. 6*d*.

Figure 6E:
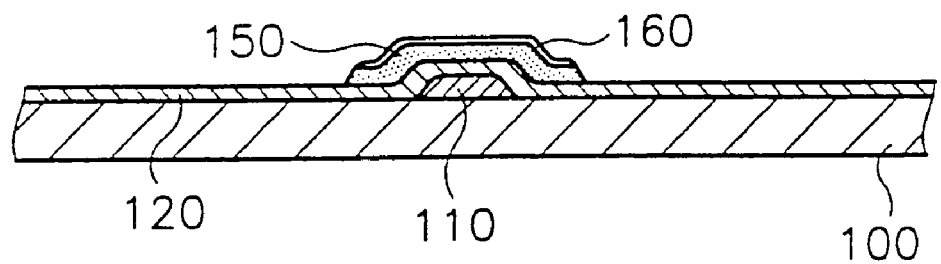

The amorphous silicon 150' and the n⁺ impurity doped amorphous silicon 160' layers are patterned to form an intrinsic semiconductor layer 150 and a doped semiconductor layer (or ohmic contact layer) 160 as shown in FIG. 6*e*.

Figure 6F:
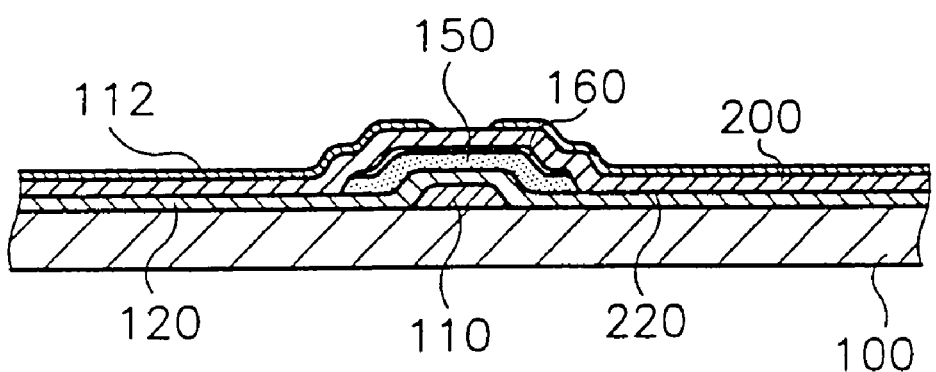

A second metal layer 200 is deposited on the resultant surface including the doped semiconductor layer 160. A second photo-resist 112 is deposited on the second metal layer 200. The photo-resist is also patterned using a mask which has lines and spaces, wherein a distance between adjacent lines is less than the resolution of the exposure system used for exposing the photo-resist. The lines and spaces of the mask are preferably located at the edge portions of the pattern of the mask. The mask, as mentioned above, preferably has lines and spaces arranged to define a comb pattern, in which a plurality of lines 510 have a width of about 1 µm and a space 520 having a width of about 0.5 µm as shown in FIG. 4. Such a novel mask 500 is used for developing and exposing the second photoresist 112 as shown in FIG. 6*f*.

Figure 6G:
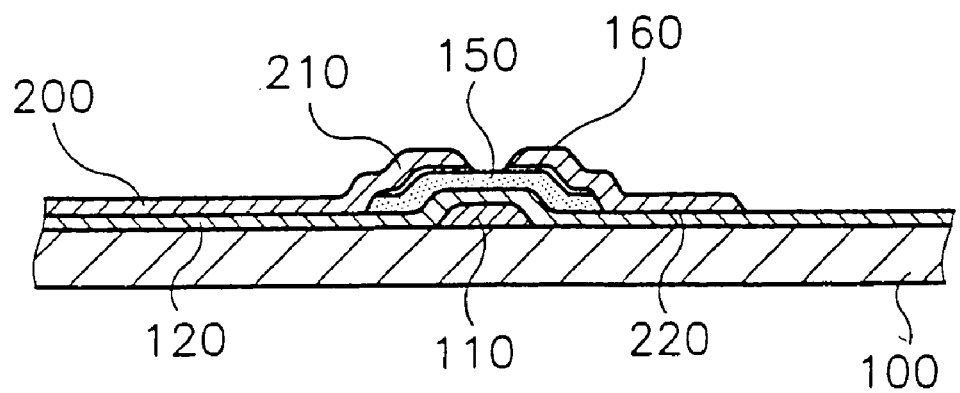

The second metal layer 200 is patterned according to the photoresist 112 patterned thereon to form a plurality of data bus lines, a data pad and a source electrode 210 derived from the gate bus line and a drain electrode 220 which faces the source electrode 210 as shown in FIG. 6*g*.

Figure 6H:
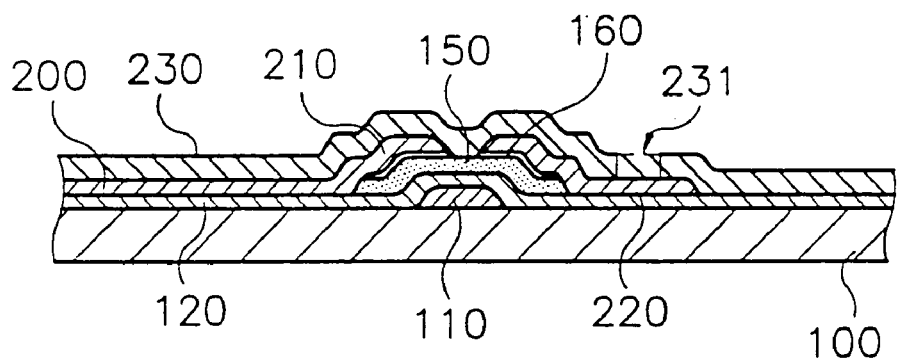

A passivation layer 230 which covers the substrate 100 including the source electrode 210 and the drain electrode 220 as shown in FIG. 6*h*.

Figure 6I:
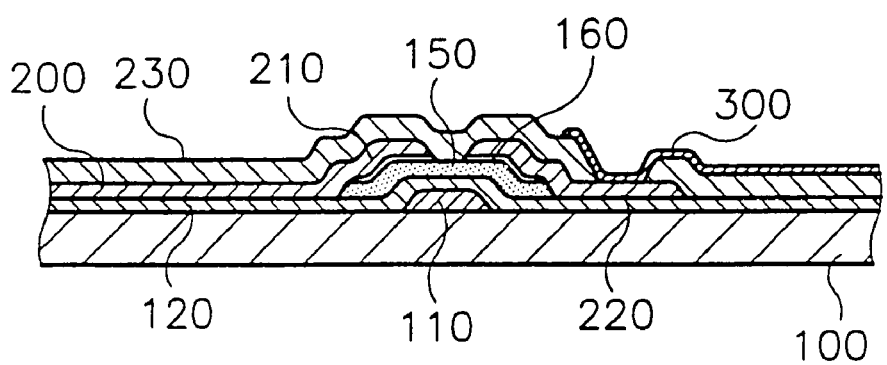

A contact hole 231 is formed by patterning the passivation layer 230 to expose some portions of the drain electrode 220. An ITO(Indium Tin Oxide) is deposited on the patterned passivation layer 230. The ITO layer is patterned to form a pixel electrode 300 contacting the drain electrode 220 through the contact hole 231 as shown in FIG. 6*i*.

According to preferred embodiments of the present invention, when a step of exposing is performed, the amount of the UV(Ultra Violet) light is controlled by using the mask 500 which has line and space patterns in which a width of the lines 510 is about 1 µm and a width of the spaces 520 is about 0.5 µm as shown in FIG. 8*a*. Therefore, the thickness of the patterned photo-resist can be controlled. The d1 portion of the mask 500 blocks the UV light so that the photo-resist fully remains. The d2 and d3 portions of the mask 500 pass some amount of the UV light through the space having a width of about 0.5 µm, so that some amount (thickness) of the photo-resist remains as shown in FIG. 8*b*. After the first metal layer 110' is patterned by using the patterned first photo-resist 111 as shown in FIG. 8*b*, the patterned metal layer 210 is formed as shown in FIG. 8*c*.

According to the above-mentioned preferred embodiment, a photolithography process is used for patterning a material layer to have a smooth tapered shape in cross-sectional view, and is performed using an exposure system (FX-510D) manufactured by Nikon. However, it is understood that another exposure system having desired resolution (for example, greater resolution) may also be suitable for embodiments disclosed herein. This Nikon exposure system of the above-mentioned preferred embodiment (FX-510D) has a resolution of 2.4 µm (independent) and 3 µm (line and space). Using this exposure system, the scale of line and space pattern is determined with 1 µm of line width and 0.5 µm of space width.

However, the scale of line and space pattern is not determined based on absolute values in every instance. Rather, the scale of line and space for embodiments disclosed herein are varied by an operator carrying out a particular photolithographic process, and may be determined based on the shape or pattern of photoresist sought or required by the designer of the material layer. In other words, depending on a desired slope shape of the mask pattern, the scale of line and space pattern may be determined mathematically with respect to the resolution of the exposure system.

A second preferred embodiment sets forth a method of obtaining a scale of line and space pattern based on the relationship between the resolution of an exposure system and a desired scale of line and space pattern.

In an example of this second preferred embodiment, the exposure system used is FX-602K (another model of Nikon). The resolution of this exposure system is 1.0 µm (line and space). However, the method is effective for an exposure system having a resultion of less than 1.0 µm (for example, 0.1 µm 0.01 µm, 0.001 µm and all points inbetween). In this embodiment, when a mask pattern has a comb shaped pattern branching out from a contour of a mask such as the mask shown in FIG. 4, an optimum scale is obtained by a procedure in which the width of line and space are varied between a chosen range. For example, a width of line and space are varied from 0.1 µm to 5 µm. As a result, the cross-sectional views of photoresist patterned with the comb shape pattern are varied (an example is shown in the FIG. 9). In this example, a desired scale of line and space is shown in FIG. 9 (region inside the circle), and is obtained when the width of line is approximately 0.3~0.4 µm and the width of space is approximately 0.2 µm. Consequently, the mathematical relationship between the scale of line and space pattern and the resolution of the exposure system is that the width of line is a value approximately equal to 1/3 of the resolution of the exposure system, and the width of space is a value approximately equal to 1/6 of the resolution of the exposure system (in this case, the width of space is about 1/2 the width of line).

In order to acquire a smooth tapered shape at the contour of the patterned material layer, the thickness of the photo-resist should be varied. To vary the thickness of the photo-resist, this invention suggests a mask pattern having a comb shaped pattern branching out from the contour of the mask pattern. In the embodiment shown in FIG. 4, the comb shaped pattern has a line and space pattern. In this embodiment, a desired slope is obtained when a width of the line is approximately 1/3 of the exposure system's resolution and the width of space is approximately 1/6 the exposure system's resolution. However, as provided above, a desired scale of line and space is obtained by procedure and based upon on the shape or pattern of photoresist sought or required by the designer of the material layer. Therefore, any ratio or combination which can be derived by the disclosed procedure may be applicable in determining an optimum scale. For example, depending on a desired slope shape of a mask pattern or a material layer, a suitable width of line to exposure system resolution ratio may range between approximately 3/10 to 1/2 (see FIG. 9). Similarly a suitable width of space to exposure system resolution ratio may range between 1/10 and 1/2 (an example of which is also shown in FIG. 9).

This procedure (and the ratios obtained thereby) can also be applied to the the first preferred embodiment in which the Nikon FX-510D exposure system is used. In other words, a 1 µm line width and 0.5 µm of space width of the example used in the first preferred embodiment yields ratios of approximately 1/3 and approximately 1/6 the resolution of the exposure system (3 µm), respectively.

Figure 7:
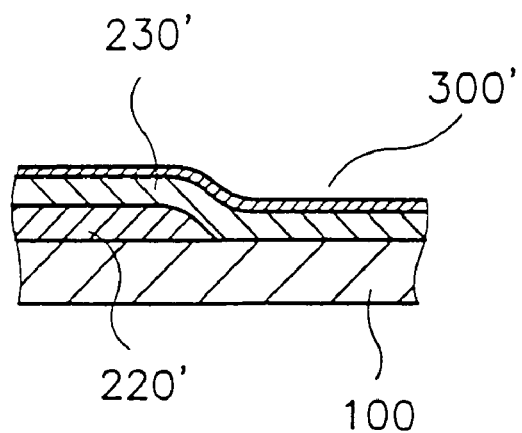
FIG. 7 is a cross-sectional view along the line B—B of the FIG. 2 according to a preferred embodiment of the present invention.

The preferred embodiments of the present invention provide a method of manufacturing an LCD including at least two stacked thin film layers in which the upper thin film smoothly and completely covers the lower thin film. According to preferred embodiments of the present invention, a mask for patterning the photoresist which covers the lower thin layer has lines and spaces arranged such that a distance between adjacent lines is less than a resolution of the exposure system used with the mask for exposing the photo-resist. As a result, the photo-resist is thinner at a location of the line and space pattern. According to preferred embodiments of the present invention, a photo-resist having at least two different thickness portions is formed in a single patterning step as shown in FIGS. 8a–8c. When the lower thin layer is etched with the patterned photo-resist, the cross-sectional shape of the lower thin layer has a smoothly tapered shape with a smooth inclined contour instead of steep sloped shape and without a shoulder. Therefore, the upper thin layer deposited on the lower thin layer smoothly covers the lower thin layer with uniform thickness as shown in FIG. 7. As a result, the upper thin layer does not have any cracks or discontinued portions. Furthermore, the lower thin layer can be perfectly covered by the upper thin layer so as not to be damaged by any etchant used for forming any thin layer deposited thereon later.

The invention being described above, it should be apparent that this invention may be varied in many ways. Such variations are not to be regarded as a departure from the spirit and scope of the invention, and all such modifications obvious to one in the skilled art, are intended to be included within the scope of the following claims.

What is claimed is:

1. A method of manufacturing a semiconductor device comprising the steps of:
    providing a substrate;
    forming a first metal layer on the substrate;
    forming a photoresist on the first metal layer; and
    exposing and developing the photoresist using an exposure system and only a single mask having lines and spaces, and a ratio of a width of a line to a resolution of the exposure system ranges between approximately 3/10 and ½, and a ratio of a width of a space to a resolution of the exposure system ranges between approximately 1/10 and ½, the lines being branched out from a side portion of the mask, such that the photoresist has a pattern including a thick portion and a thin portion, the pattern being a comb shape.

2. The method of claim 1, wherein the exposure system's resolution is 1 µm or less.

3. The method of claim 1, wherein a ratio of a width of a line to a resolution of the exposure system is 1/3, and a ratio of a width of a space to a resolution of the exposure system is approximately 1/6.

4. A method of manufacturing a semiconductor device comprising the steps of:
    providing a substrate;
    forming a layer on the substrate;
    forming a photoresist on the layer; and
    performing a single masking step using an exposure system and a mask having lines and spaces, wherein a ratio of a width of a line to a resolution of the exposure system ranges between approximately 3/10 and ½ and a ratio of a width of a space to a resolution of the exposure system ranges between approximately 1/10 and ½, the lines being branched out from a side portion of the mask, the masking step being used to develop the photoresist such that the photoresist has a thick portion and a thin portion, the photoresist having a comb shape.

5. The method of claim 4, wherein the exposure system's resolution is 1 µm or less.

6. The method of claim 4, wherein a ratio of a width of a line to a resolution of the exposure system is 1/3, and a ratio of a width of a space to a resolution of the exposure system is approximately 1/6.

7. A method of manufacturing a liquid crystal display comprising the steps of:
    providing a substrate;
    forming a layer on the substrate;
    forming a photoresist on the layer; and
    exposing and developing the photoresist using an exposure system and only a single mask having lines and spaces, and a ratio of a width of a line to a resolution of the exposure system ranges between approximately 3/10 and ½, and a ratio of a width of a space to a resolution of the exposure system ranges between approximately 1/10 and ½, the lines being branched out from a side portion of the mask such that the photoresist has a pattern including a thick portion and a thin portion, the pattern being a comb shape.

8. The method of claim 7, wherein the exposure system's resolution is 1 µm or less.

9. The method of claim 7, wherein a ratio of a width of a line to a resolution of the exposure system is 1/3, and a ratio of a width of a space to a resolution of the exposure system is approximately 1/6.

10. A method of manufacturing a liquid crystal display comprising the steps of:
    providing a substrate;
    forming a layer on the substrate;
    forming a photoresist on the layer; and
    performing a single masking step using an exposure system and a mask having lines and spaces, and ratio of a width of a line to a resolution of the exposure system ranges between approximately 3/10 and ½, and a ratio of a width of a space to a resolution of the exposure system ranges between approximately 1/10 and ½, the lines being branched out from a side portion of the mask to develop the photoresist such that the photoresist has a thick portion and a thin portion, the photoresist being a comb shape.

11. The method of claim 10, wherein the exposure system's resolution is 1 µm or less.

12. The method of claim 10, wherein a ratio of a width of a line to a resolution of the exposure system is 1/3, and a ratio of a width of a space to a resolution of the exposure system is approximately 1/6.

13. A method of manufacturing a semiconductor device comprising the steps of:
    providing a substrate;
    forming a first metal layer on the substrate;
    forming a photoresist on the first metal layer; and
    exposing and developing the photoresist using an exposure system and only a single mask having lines and spaces, and a ratio of a width of a line to a resolution of the exposure system ranges between approximately 3/10 and ½, and a ratio of a width of a space to a resolution of the exposure system ranges between approximately 1/10 and ½, the lines being branched out from a side portion of the mask such that the photoresist has a pattern including a thick portion and a thin portion.

14. The method of claim 13, wherein the exposure system's resolution is 1 µm or less.

15. The method of claim 13, wherein a ratio of a width of a line to a resolution of the exposure system is 1/3, and a ratio of a width of a space to a resolution of the exposure system is approximately 1/6.

16. A method of manufacturing a semiconductor device comprising the steps of:
provviding a substrate;
forming a layer on the substrate;
forming a photoresist on the layer; and
performing a single masking step using an exposure system and a mask having lines and spaces, and a ratio of a width of a line to a resolution of the exposure system ranges between approximately 3/10 and ½, and a ratio of a width of a space to a resolution of the exposure system ranges between approximately 1/10 and ½, the lines being branched out from a side portion of the mask, the masking step being used to develop the photoresist such that the photoresist has a thick portion and a thin portion.

17. The method of claim 16, wherein the exposure system's resolution is 1 μm or less.

18. The method of claim 16, wherein a ratio of a width of a line to a resolution of the exposure system is 1/3, and a ratio of a width of a space to a resolution of the exposure system is approximately 1/6.

19. A method of manufacturing a liquid crystal display comprising the steps of:
providing a substrate;
forming a layer on the substrate;
forming a photoresist on the layer; and
exposing and developing the photoresist using an exposure system and only a single mask having lines and spaces, and a ratio of a width of a line to a resolution of the exposure system ranges between approximately 3/10 and ½, and a ratio of a width of a space to a resolution of the exposure system ranges between approximately 1/10 and ½, the lines being branched out from a side portion of the mask such that the photoresist has a pattern including a thick portion and a thin portion.

20. The method of claim 19, wherein the exposure system's resolution is 1 μm or less.

21. The method of claim 19, wherein a ratio of a width of a line to a resolution of the exposure system is 1/3, and a ratio of a width of a space to a resolution of the exposure system is approximately 1/6.

22. A method of manufacturing a liquid crystal display comprising the steps of:
providing a substrate;
forming a layer on the substrate;
forming a photoresist on the layer; and
performing a single masking step using an exposure system and a mask having lines and spaces, and a ratio of a width of a line to a resolution of the exposure system ranges between approximately 3/10 and ½, and a ratio of a width of a space to a resolution of the exposure system ranges between approximately 1/10 and ½, the lines being branched out from a side portion of the mask to develop the photoresist such that the photoresist has a thick portion and a thin portion.

23. The method of claim 22, wherein the exposure system's resolution is 1 μm or less.

24. The method of claim 22, wherein a ratio of a width of a line to a resolution of the exposure system is 1/3, and a ratio of a width of a space to a resolution of the exposure system is approximately 1/6.

* * * * *